(12) United States Patent
Shionoya

(10) Patent No.: US 6,504,771 B2
(45) Date of Patent: Jan. 7, 2003

(54) SEMICONDUCTOR DEVICE, SYSTEM, AND METHOD OF CONTROLLING ACCESSING TO MEMORY

(75) Inventor: Shinichi Shionoya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/124,581

(22) Filed: Apr. 18, 2002

(65) Prior Publication Data

US 2002/0154559 A1 Oct. 24, 2002

(30) Foreign Application Priority Data

Apr. 19, 2001 (JP) ........................................ 2001-120853

(51) Int. Cl.[7] .............................. G11C 7/00; G11C 29/00
(52) U.S. Cl. ....................................... 365/200; 365/201
(58) Field of Search ..................... 365/230.03, 230.06, 365/200, 201

(56) References Cited

U.S. PATENT DOCUMENTS

| | | | | |
|---|---|---|---|---|
| 5,550,394 A | * | 8/1996 | Sukegawa et al. | 257/209 |
| 6,144,592 A | * | 11/2000 | Kanda | 365/200 |
| 6,167,540 A | * | 12/2000 | Azuma | 365/200 |
| 6,337,832 B1 | * | 1/2002 | Ooishi et al. | 365/230.01 |

FOREIGN PATENT DOCUMENTS

JP         10-242288        9/1998

* cited by examiner

*Primary Examiner*—Trong Phan
(74) *Attorney, Agent, or Firm*—Foley & Lardner

(57) ABSTRACT

Test circuits, which determine whether memory blocks including at least one redundant block are defective, are included in the memory blocks, respectively. A decoding rule generating circuit so generates a decoding rule that a defective block can not be accessed, and outputs the generated decoding rule as a decoding-rule signal RUL. Under the decoding rule, the redundant address decoder decodes the address signal ADDR, to permit access to the memory blocks except the defective block(s).

7 Claims, 9 Drawing Sheets

SEMICONDUCTOR DEVICE, SYSTEM, AND METHOD OF CONTROLLING ACCESSING TO MEMORY

BACKGROUND OF THE INVENTION

1. Field of the Invention

The present invention relates to a semiconductor device including a reliable memory, a system, and a method of controlling accessing to the memory.

2. Description of the Related Art

In recent years, in logic integrated circuit devices, such as ASIC (Application Specific Integrated circuits) having a semiconductor memory (e.g. a random access memory, etc.) mounted thereon, the capacity of the semiconductor memory has increased. Thus, the area occupied by the semiconductor memory has become larger, and the number of transistors has increased, within a single logic integrated circuit device.

The semiconductor memory does not satisfactorily operate, if there is even one single defective memory cell in a plurality of memory cells of the semiconductor memory. If a logic integrated circuit device includes a semiconductor memory device, having such a defective memory cell, the logic integrated circuit device is dealt as a defective circuit device. Thus, to enhance the product yield, it is required that there be a so-called "memory repairing method" of repairing the memory device having such a defective memory cell.

According to one memory repairing method, a redundant memory cell is prepared in a memory device, and a defective memory cell is replaced with the redundant memory cell. In a logic integrated circuit device having such a memory device mounted therein, there is included a redundancy circuit (a repairing circuit) for replacing the defective memory cell with a redundant cell.

The redundancy circuit operates in a manner as will be explained below. The redundancy circuit stores an address of the defective memory cell which has been detected at the testing of the wafer. If the address of this defective memory cell is specified, the redundancy circuit causes this defective memory cell not to be accessed, and causes this redundant memory cell to be accessed, instead. In this manner, if the defective memory cell is replaced with the redundant memory cell, the semiconductor integrated circuit device including the memory device can be repaired so as to normally be operated.

According to the above method, the address of the defective memory cell is stored prior to the packaging of the semiconductor integrated circuit. Therefore, if there will be a defective memory cell after the packaging, the semiconductor integrated circuit device can not be repaired.

Therefore, it is demanded that there will be a system for detecting any defective memory cell included thereinside at its usage point by itself and replacing the detected defective memory cell with a redundant memory cell, as a method of repairing the defective memory cell. Such a system is disclosed in Unexamined Japanese Patent Applicant KOKAI Publication No. H10-242288, for example.

A logic integrated circuit (LSI) 100 having the above-described structure is shown in FIG. 9. The logic integrated circuit 100 shown in FIG. 9 includes a logical circuit (LC) 101 and a random access memory (RAM) 102. The random access memory 102 includes a semiconductor memory having redundant elements which are arrayed in an "X" address direction or a "Y" address direction. A built-in self-test circuit (BIST) 103 and a redundant address switching circuit (RAXC) 104 are arranged between the logical circuit 101 and the random access memory 102. The circuits included in the logic integrated circuit 100 are connected with each other through an address bus (ADDR), a data bus (DATA) and a control-signal bus (CTL).

The built-in self-test circuit 103 performs functional testing of the random access memory 102, at the time of power-ON resetting. The redundant address switching circuit 104 receives a result of the test from the built-in self-test circuit 103, and automatically replaces a defective element with a redundant element.

Recently, for a memory having a large capacitance, there has been developed a constitution having a random access memory divided in a plurality of blocks. However, in the system above, if a block is deteriorated after packaging, the defective block can not be repaired. For example, in the case of a deletion in a line for enable signals or a defect of a block decoder, in which the access to the memory block is impossible. Thus, just one defective block among a plurality of blocks makes the entire memory device defective.

SUMMARY OF THE INVENTION

The present invention has been made in consideration of the above. It is accordingly an object of the present invention to provide a semiconductor device including a reliable memory and a system for and method of controlling accessing to the memory.

Another object of the present invention is to provide a highly reliable semiconductor device including a plurality of memory blocks and a system for and method of controlling accessing to the memory.

In order to achieve the above object, according to the first aspect of the present invention, there is provided a semiconductor device comprising:

a memory circuit including a plurality of memory blocks and at least one redundant memory block;

a test circuit which performs functional testing of said memory circuit in unit of blocks;

a selecting-rule generating circuit which generates a selecting rule for selecting accessible memory blocks, so that the one or more memory block(s) among the plurality of the memory blocks which is(are) determined as defective by said test circuit will be avoided, while the at least one redundant memory block of the same number of the one or more memory block(s) determined as defective will be accessible;

a block selecting circuit which selects the accessible memory blocks, based on the selecting rule generated by said selecting-rule generating circuit; and a logical circuit which accesses the accessible memory blocks to read/write data therefrom/thereto.

The test circuit may be provided in each of said memory blocks.

The test circuit may be included in said logic circuit.

The selecting-rule generating circuit may be included in said logic circuit.

The test circuit and said selecting-rule generating circuit may be included in said logic circuit.

In order to achieve the above object, according to the second aspect of the present invention, there is provided a system including the semiconductor device according to the first aspect of the present invention.

In order to achieve the above object, according to the third aspect of the present invention, there is provided a method of controlling accessing to a memory circuit comprising a plurality of memory blocks and at least one redundant memory block, said method comprising:

performing functional testing of said memory circuit in unit of the memory blocks, and determining whether each of the plurality of memory blocks is defective;

generating a selecting rule for selecting accessible memory blocks, so that the one or more memory block(s) among the plurality of the memory blocks which is(are) determined as defective by said testing will be avoided, while the at least one redundant memory block of the same number of the one or more memory block(s) determined as defective will be accessible;

selecting the accessible memory blocks, based on the selecting rule generated; and accessing the accessible memory blocks to read/write data therefrom/thereto.

BRIEF DESCRIPTION OF THE DRAWINGS

The object and other objects and advantages of the present invention will become more apparent upon reading of the following detailed description and the accompanying drawings in which.

DETAILED DESCRIPTION OF THE PREFERRED EMBODIMENT

A logic integrated circuit device according to an embodiment of the present invention will now be described with reference to the accompanying drawings.

Figure 1:
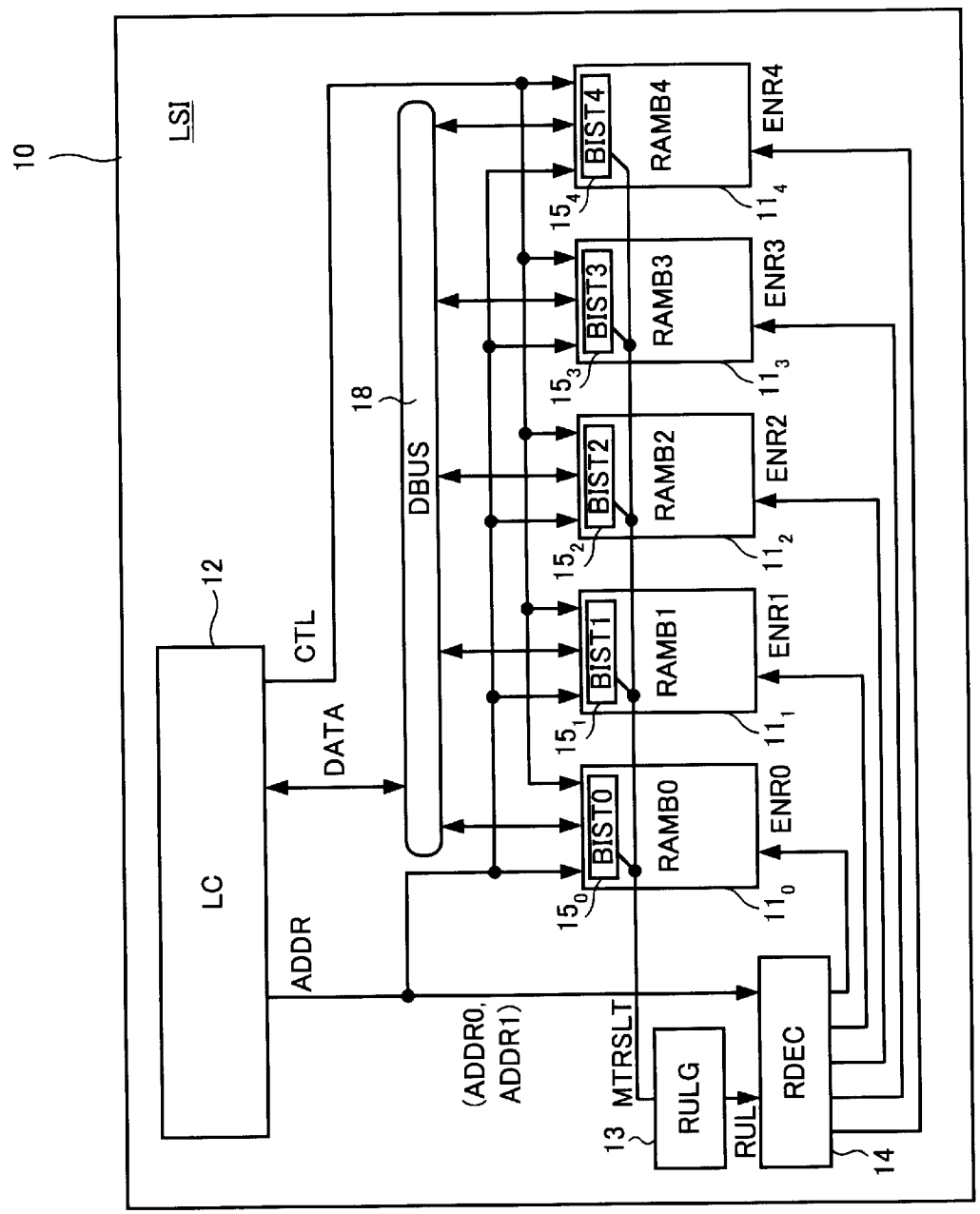
FIG. 1 is a diagram showing the structure of a logic integrated circuit device according to the embodiment of the present invention.

FIG. 1 is a block diagram showing a logic integrated circuit device (LSI) 10 according to the embodiment of the present invention. This logic integrated circuit device 10 is included in a predetermined computer system, together with other non-illustrative functional blocks, such as a CPU (Central Processing Unit) and the like.

As shown in FIG. 1, the logic integrated circuit device 10 according to the embodiment of the present invention comprises the $0^{th}$ to $4^{th}$ random access memory blocks (RAMB0 to RAMB4) $11_0$ to $11_4$, a logical circuit (LC) 12, a decoding-rule generating circuit (RULG) 13 and a redundant address decoder (RDEC) 14.

The $0^{th}$ to $4^{th}$ random access memory blocks $11_0$ to $11_4$ are included in the logic integrated circuit device 10 so as to form a semiconductor memory as an internal circuit thereof. Each of the $0^{th}$ to $4^{th}$ random access memory blocks $11_0$ to $11_4$ includes a plurality of memory cells, consisting of volatile semiconductor memory such as dynamic RAM or static RAM.

One of the $0^{th}$ to $4^{th}$ random access memory blocks $11_0$ to $11_4$ is set as a redundant memory block, and the rest of the blocks are used as accessible memory blocks. In this embodiment, the $4^{th}$ random access memory block is set as a redundant memory block.

The $0^{th}$ to $4^{th}$ random access memory blocks $11_0$ to $11_4$ include $0^{th}$ to $4^{th}$ built-in self-test circuits (BIST0 to BIST4) $15_0$ to $15_4$, respectively. Each of the $0^{th}$ to $4^{th}$ built-in self-test circuits $15_0$ to $15_4$ performs functional testing of its memory block, and determines whether the memory block is in a good state or defective. Each of the $0^{th}$ to $4^{th}$ built-in self-test circuits $15_0$ to $15_4$ outputs a result of the determination as a memory-test result signal MTRSLT.

Each of the $0^{th}$ to $4^{th}$ built-in self-test circuits $15_0$ to $15_4$ carries out the test at the time of power-ON resetting, for example.

The logical circuit 12 is composed of, for example, a combination of a plurality of gate-array cells or standard cells. The logical circuit 12 is connected to a CPU of a non-illustrative computer system, through a non-illustrative system bus, etc.

The logical circuit 12 is connected to the $0^{th}$ to $4^{th}$ random access memory blocks $11_0$ to $11_4$. The logical circuit 12 sends an address signal ADDR and a control signal CTL to each of the $0^{th}$ to $4^{th}$ random access memory blocks $11_0$ to $11_4$.

The address signal ADDR of n-bits specifies a memory address. That is, the higher two bits address signals ADDR0, ADDR1 of the address signal ADDR identify one of the $0^{th}$ to $3^{rd}$ random access memory blocks $11_0$ to $11_3$. The rest of the lower bit address signal identify an address of a memory cell in the corresponding memory block.

The control signal CTL is to control a read/write operation for reading/writing data from/to a storage device corresponding to the memory cell specified by the address signal ADDR.

The data, which has been read out from or written into any of the $0^{th}$ to $4^{th}$ random access memory blocks $11_0$ to $11_4$, is sent to the logical circuit 12 through a data bus DRUS 18.

The decoding-rule generating circuit 13 receives the memory-test result signal MTRSLT output by any of the $0^{th}$ to $4^{th}$ built-in self-test circuits $15_0$ to $15_4$. The decoding-rule generating circuit 13 generates a decoding rule to be referred by a redundant address decoder 14, as will be described later, and outputs the generated decoding rule to the redundant address decoder 14, as a decoding rule signal RUL.

The decoding-rule generating circuit 13 generates a decoding rule such that a memory block determined in the memory test as defective will be replaced to the redundant memory block.

The redundant address decoder 14 receives a memory-test result signal MTRSLT from each of the $0^{th}$ to $4^{th}$ built-in self-test circuits $15_0$ to $15_4$ and 2-bit address signals ADDR0, ADDR1 from the logical circuit 12.

The redundant address decoder 14 selectively activates an accessible memory block, based on the received decoding-rule generating signal RUL and the 2-bit address signals ADDR0, ADDR1.

In other words, based on the generated decoding rule, the redundant address decoder 14 selects the redundant memory block instead of a memory block which is determined as a defective block in the memory test.

Specifically, the redundant address decoder 14 outputs enable signals ENR0 to ENR4, each of which has a level of "High" or "Low", to the $0^{th}$ to $4^{th}$ random access memory blocks $11_0$ to $11_4$, respectively, to activate or inactivate the enable signals. In the embodiment, the level "High" signal activates the corresponding memory block.

More specifically, upon reception of an enable signal which is set to the level "High", a memory block corresponding to the signal is activated for access. On the other hand, upon reception of an enable signal which is set to the level "Low", a memory block corresponding to the signal is deactivated (disabled) for access.

Figure 2:
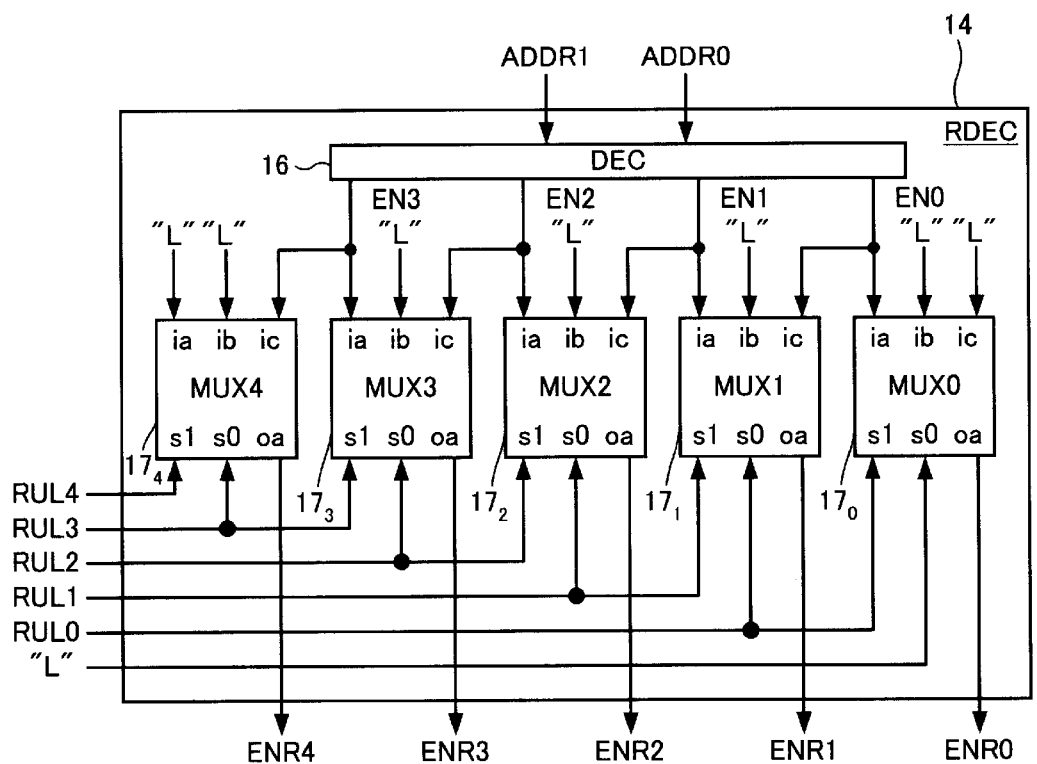
FIG. 2 is a diagram showing the structure of a redundant address decoder shown in FIG. 1.

Explanations will now specifically be made to the redundant address decoder 14 shown in FIG. 1. FIG. 2 shows the structure of the redundant address decoder 14 included in the logic integrated circuit device 10 according to this embodiment.

As seen from FIG. 2, the redundant address decoder 14 inputs the 2-bit address signals ADDR0, ADDR1 and the decoding-rule signals RUL0 to RUL4, and outputs 5-bit enable signals ENR0 to ENR4.

To accomplish the input and output as above, the redundant address decoder 14 includes a 2-input 4-output decoder (DEC) 16 and $0^{th}$ to $4^{th}$ 3-input multiplexer (MUX0 to MUX4) $17_0$ to $17_4$.

The decoding-rule signals RUL0 to RUL4 have a value of 0 to 1. As explained above, the decoding-rule signals RUL0 to RUL4 is set based on the memory test result signal MTRSLT. The redundant address decoder 14 receives the decoding-rule signals RUL0 to RUL4, and send signals for deactivating one of the memory blocks, as precisely detailed below.

The 2-input 4-output decoder 16 receives the 2-bit address signals ADDR0, ADDR1, and outputs enable signals EN0 to EN3 each including one-bit data, respectively to the $0^{th}$ to $4^{th}$ random access memory blocks $11_0$ to $11_4$.

The decoder 16 decodes the address signals ADDR0, ADDR1 having the value of 0 or 1 and sets one of the enable signals EN0 to EN3 as a level "High" signal.

Each of the $0^{th}$ to $4^{th}$ 3-input multiplexers $17_0$ to $17_4$ has three input terminals ia, ib and ic, two selection-signal input terminals s1 and s0 and an output terminal oa.

The enable signal EN0 output from the decoder 16 is input both to the first input terminal ia of the $0^{th}$ 3-input multiplexer $17_0$ and to the third input terminal ic of the $1^{st}$ 3-input multiplexer $17_1$.

The enable signal EN1 of the decoder 16 is input both to the first input terminal ia of the $1^{st}$ 3-input multiplexer $17_1$ and to the $3^{rd}$ input terminal ic of the $2^{nd}$ 3-input multiplexer $17_2$.

The enable signal of the decoder 16 is input both to the first input terminal ia of the $2^{nd}$ 3-input multiplexer $17_2$ and to the third input terminal ie of the $3^{rd}$ 3-input multiplexer $17_3$.

The enable signal EN3 of the decoder 16 is input both to the first input terminal ia of the $3^{rd}$ 3-input multiplexer $17_3$ and to the third input terminal ic of the $4^{th}$ 3-input multiplexer $17_4$.

The level "Low" signal ("L" i.e. "0") is input to:

the second and third input terminals ib and ic of the $0^{th}$ 3-input multiplexer $17_0$;

the second input terminal ib of the $1^{st}$ 3-input multiplexer $17_1$;

the second input terminal ib of the $2^{nd}$ 3-input multiplexer $17_2$;

the second input terminal ib of the $3^{rd}$ 3-input multiplexer $17_3$; and first and second input terminals ia and ib of the $4^{th}$ 3-input multiplexer $17_4$.

The decoding-rule signal RUL0 is input both to the selection-signal input terminal s1 of the $0^{th}$ 3-input multiplexer MUX0 $17_0$ and to the selection-signal input terminal s0 of the $1^{st}$ 3-input multiplexer $17_1$.

The decoding-rule signal RUL1 is input both to the selection-signal input terminal s1 of the $1^{st}$ 3-input multiplexer $17_1$ and to the selection-signal input terminal s0 of the $2^{nd}$ 3-input multiplexer $17_2$.

The decoding-rule signal RUL2 is input both to the selection-signal input terminal s1 of the $2^{nd}$ 3-input multiplexer $17_2$ and to the selection-signal input terminal s0 of the $3^{rd}$ 3-input multiplexer $17_3$.

The decoding-rule signal RUL3 is input both to the selection-signal input terminal s1 of the $3^{rd}$ 3-input multiplexer $17_3$ and to the selection-signal input terminal s0 of the $4^{th}$ 3-input multiplexer $17_4$.

The decoding-rule signal RUL4 is input to the selection-signal input terminal s1 of the $4^{th}$ 3-input multiplexer $17_4$.

Input to the selection-signal input terminal s0 of the $0^{th}$ 3-input multiplexer MUX0 $17_0$ is the level "Low" signal.

Each of the $0^{th}$ to $4^{th}$ 3-input multiplexers $17_0$ to $17_4$:

selects its first input terminal ia, when the signal input to the selection-signal input terminal s1 is 0 (s1=0) and the signal input to the selection-signal input terminal s0 is 0 (s0=0);

selects its second input terminal ib, when s1, s0=1, 0;

selects its third input terminal ic, when s1, s0=1, 1, and wherein s1, s0=0, 1 is prohibited.

Each of the $0^{th}$ to $4^{th}$ 3-input multiplexers $17_0$ to $17_4$ outputs the signal input to each of the selected terminals, from the output terminal oa as one of the enable signals ENR0 to ENR4.

The decoding-rule generating circuit 13 generates the enable signals ENR0 to ENR4, based on the address signal ADDR0, ADDR1 and the decoding-rule signal RUL0 to RUL4, as will be explained below.

CASE(1)

The case where no memory block is determined as defective in the functional testing of the memory blocks In this case, the decoding-rule generating circuit 13 outputs the decoding-rule signals RUL0 to RUL4 as level "Low". The enable signal ENR4 from the $4^{th}$ multiplexer $17_4$ is always set to level "Low", thereby the redundant $4^{th}$ random access memory block $11_4$ is inactivated.

Particularly, when the address signal ADDR0, ADDR1=0, 0, the enable signal ENR0 is set to a level "High", to activate the $0^{th}$ random access memory block $11_0$;

when the address signal ADDR0, ADDR1=1, 0, the enable signal ENR1 is set to a level "High", to activate the $1^{st}$ random access memory block $11_1$;

when the address signal ADDR0, ADDR1=0, 1, the enable signal ENR2 is set to a level "High", to activate the $2^{nd}$ random access memory block $11_2$;

when the address signal ADDR0, ADDR1=1, 1, the enable signal ENR3 is set to a level "High", to activate the $3^{rd}$ random access memory block $11_3$.

Thus, the enable signal LNR4 is always set to a level "Low", and the redundant $4^{th}$ random access memory block $11_4$ is not be activated.

CASE(2)

The case where one of non-redundant memory blocks, for example, the $1^{st}$ random access memory block 11, is determined as defective in the functional testing of the memory cells In this case, the decoding-rule generating circuit 13 outputs the decoding-rule signals RUL0 as level "Low" and the decoding-rule signals RUL1 to RUL4 as level "High". The enable signal ENR1 from the $1^{st}$ multiplexer $17_1$ is always set at level "Low", while the enable signal ENR4 from the $4^{th}$ multiplexer $17_4$ can be set at level "High". Thereby the redundant $1^{st}$ random access memory block $11_1$ is inactivated, while the redundant $4^{th}$ random access memory $11_4$ may be activated.

Particularly, when the address signal ADDR0, ADDR1=0, 0, the enable signal ENR0 is set to a level "High", to activate the $0^{th}$ random access memory block $11_0$;

when the address signal ADDR0, ADDR1=1, 0, the enable signal ENR2 is set to a level "High", to activate the $2^{nd}$ random access memory block $11_2$;

when the address signal ADDR0, ADDR1=0, 1, the enable signal ENR3 is set to a level "High", to activate the $3^{rd}$ random access memory block $11_3$;

when the address signal ADDR0, ADD1=1, 1, the enable signal ENR4 is set to a level "High", to activate the $4^{th}$ random access memory block $11_4$.

Thus, the enable signal ENR0 to ENR4 are set as above, thereby the $1^{st}$ random access memory block $11_1$ is not be activated and the redundant $4^{th}$ random access memory block $11_4$ may be activated.

More generally, in the case where it is determined that a random access memory block $11_n$ (n represents one of 0, 1, 2, 3 and 4) which is activated by a enable signal ENRn is defective, the decoding-rule signal(s) RULn to RUL4 is set to a level "High", while the rest of the decoding-rule signal(s) is set to a level "Low". By setting the decoding-rule signal RUL0 to RUL4 set as above, the enable signal ENRn is always inactivated while the rest of the decoding-rule signals may be activated.

Operations of the logic integrated circuit device 10 having the above-described structure will now be explained.

Figure 3:
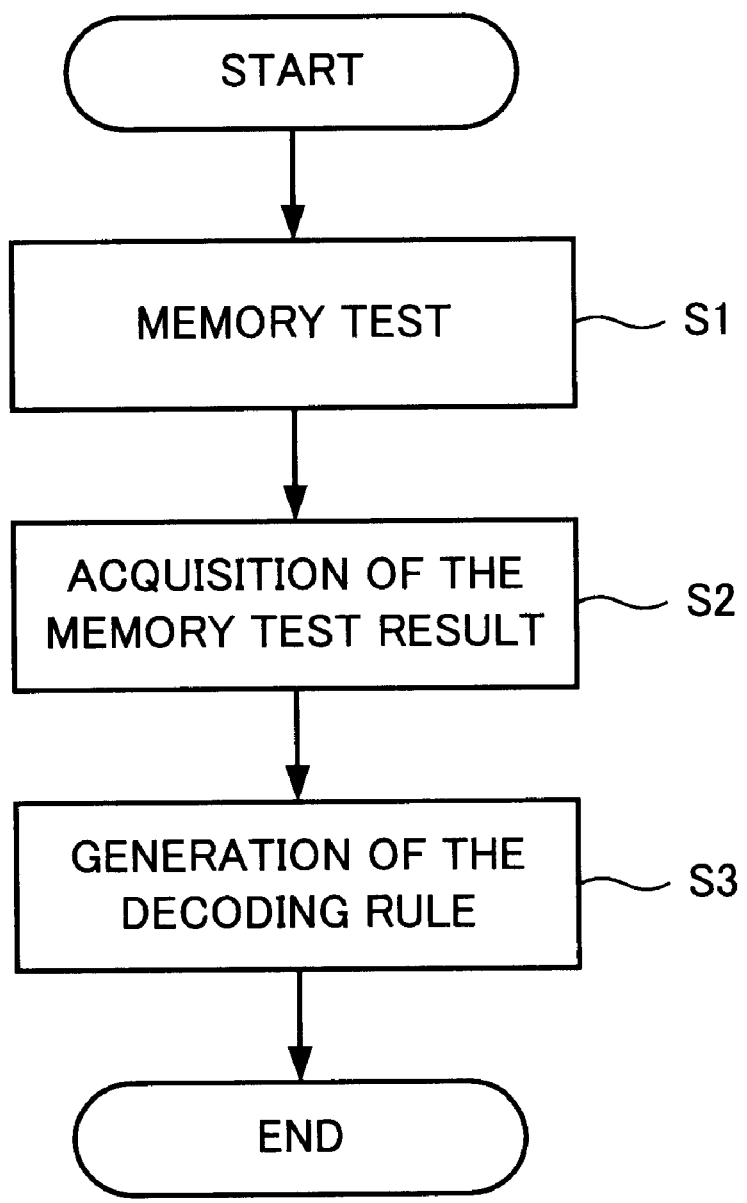
FIG. 3 is a flowchart showing operations of the logic integrated circuit device of FIG. 1.

FIG. 3 shows a flow chart for explaining a repair method of repairing a semiconductor memory using the above-described logic integrated circuit device 10. The operations of the logic integrated circuit device 10 are explained by way of example, and the present invention is not limited thereto.

At a predetermined point after the logic integrated circuit device 10 is ON, for example, each of the $0^{th}$ to $4^{th}$ built-in self-test circuits included in the respective $0^{th}$ to $4^{th}$ random access memory blocks $11_0$ to $11_4$ performs functional testing of the memory cells included in the block (Step S1).

Let it be assumed that, in the initial state, the $4^{th}$ random access memory block $11_4$ is set as a redundant memory block. Explanations will now be made to the initial operations of the logic integrated circuit device 10.

Each of the $0^{th}$ to $4^{th}$ built-in self-test circuits $15_0$ to $15_4$ acquires good/defective-memory information of each memory block from the test result (Step S2). After this, each of the $0^{th}$ to $4^{th}$ built-in self-test circuits $15_0$ to $15_4$ outputs the acquired good/defective-memory information to the decoding-rule generating circuit 13 as a memory-test result signal MTRSLT. Each of the $0^{th}$ to $4^{th}$ built-in self-test circuits $15_0$ to $15_4$ determines that its memory block is a defective memory block, if there is found one or more defective memory cells therein.

The decoding-rule generating circuit 13 generates a decoding rule based on the received test-result signal MTRSLT, and outputs the generated decoding rule as a decoding-rule signal RUL (Step S3). If a memory block determined as defective, the decoding-rule generating circuit 13 generates the decoding-rule signal RUL so that the access to the defective memory block is avoided.

The address decoder 14 decode the received address signals ADDR0, ADDR1 based on the decoding-rule signal RUL, to specify the corresponding memory block. The decoding rule is set so that the access to a defective memory block is avoided and the access to the redundant memory block is possible.

After the redundant address decoder 14 is set in the above-described manner, the logical circuit 12 accesses the selected memory blocks to read/write data from/to the memory blocks.

As explained above, in this embodiment, even in the case where there is a defective memory block after the packaging of the logic integrated circuit device 10, the logic integrated circuit device 10 can be used while the accessing to the defective memory block is avoided. That is, the defective memory block is replaced with a redundant memory block, thereby repairing the memory circuit itself. Therefore, the semiconductor integrated circuit device (LSI) including the above-described memory circuit and the computer system including such a semiconductor integrated circuit device can be realized with high reliability.

The present invention is not limited to the above embodiment, and various changes and modifications can be made thereto. Explanations will now be made to a modification to the above-described embodiment.

In the above embodiment, the explanations have been made to the case where one of the five random access memory blocks is the redundant memory block. However, the present invention is not limited to this, and can be adapted for the case where a plurality of redundant memory blocks are included a plurality (five or more than five) of memory blocks.

Generally, in the case where an "m" number of redundant memory blocks are included in an "n" number of memory blocks, (n+m) bits of enable signals are necessary. To generating the "n" number of the enable signals at either level of a "High" or "Low", address signals need to include a number of bits which is a minimum integer equal to or greater than "log2 (n)", i.e. a logarithm of (n) to the base "2". In response to address signals from the logical circuit 12, the redundant address decoder 14 generates an enable signal(s). In the case where the redundant address decoder receives "n" bits of address signals, the redundant address decoder 14 generates (2"+m) bits of enable signals. In this structure, the present invention can be adapted to the case where "m" number of redundant memory blocks are included in the logic integrated circuit device.

Figure 4:
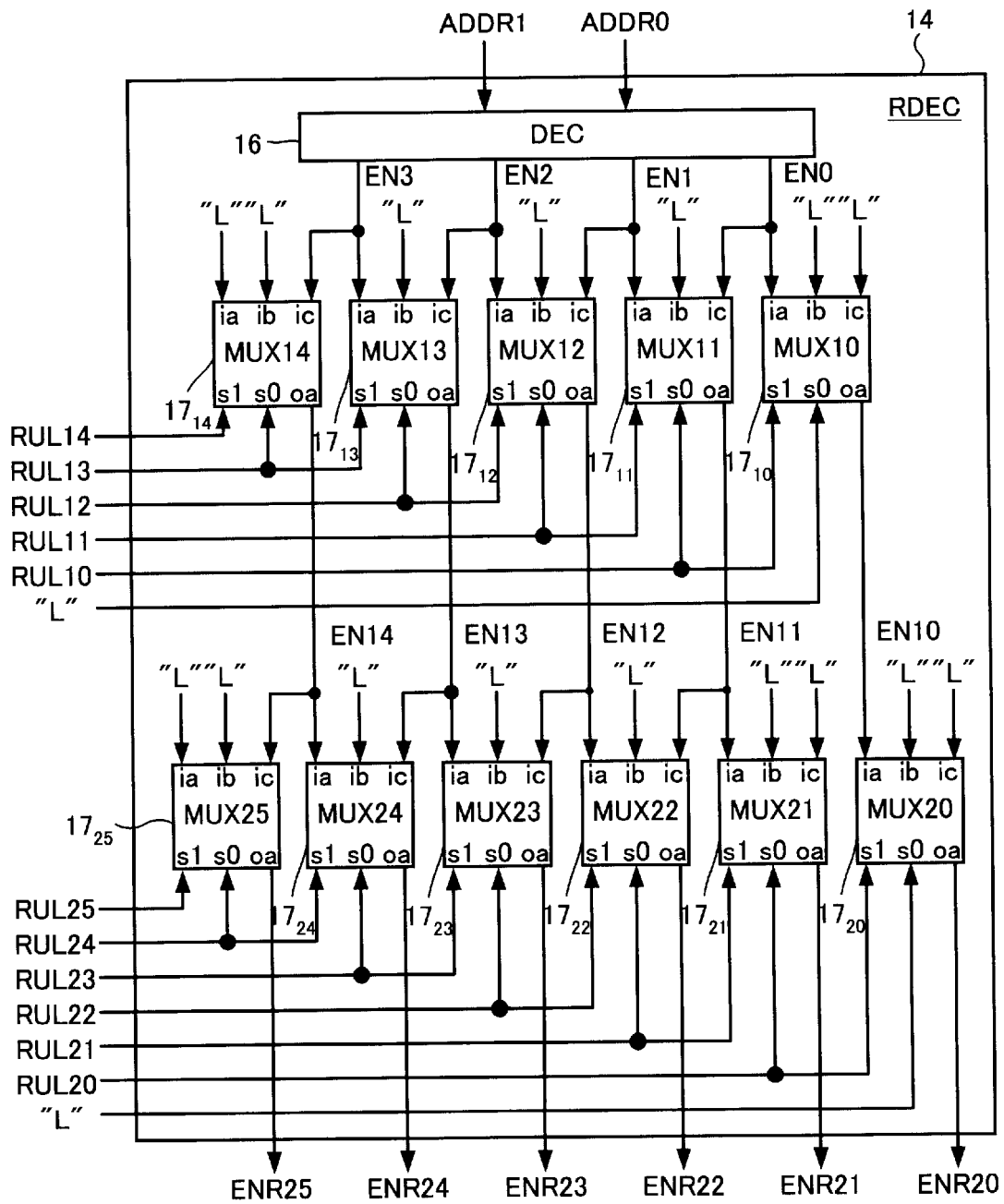
FIG. 4 is a diagram showing another structure of a redundant address decoder included in the logic integrated circuit.

FIG. 4 shows a redundant address decoder 14 has the structure for the memory circuit, wherein two redundant memory blocks are included in four memory blocks. For the sake of simplicity explanation, in FIG. 4, the same numerical numbers are affixed to the same elemental components as those shown in FIG. 2.

The redundant address decoder 14 outputs 6-bit enable signals ENR20 to ENR25, in response to the input of the 2-bit address signals ADDR0, ADDR1. The enable signals ENR20 to ENR25 activate or inactivate the $0^{th}$ or $3^{rd}$ memory blocks (RAMB0 to RAMB3), not shown, the $4^{th}$ and $5^{th}$ redundant memory block (RAMB4, RAMB5).

The redundant address decoder 14 shown in FIG. 4 are input two sets of decoding-rule signals, one set of which include decoding-rule signals RUL10 to RUL14 and the other set of which include decoding-rule signals RUL20 to RUL25. How to determine the two sets of decoding-rule signals RUL10 to RUL14, RUL20 to RUL25 will now be explained.

Each of $10^{th}$ to $14^{th}$ 3-input multiplexers (MUX10 to MUX14) $17_{10}$ to $17_{14}$ and $20^{th}$ to $25^{th}$ 3-input multiplexers (MUX20 to MUX25) $17_{20}$ to $17_{25}$;

selects its first input terminal ia, when the signal input to the selection-signal input terminal s1 is 0 (s1=0) and the signal input to the selection-signal input terminal s0 is 0 (s0=0);

selects its second input terminal ib, when s1, s0=1, 0; and selects its third input terminal ic, when s1, s0=1, 1, wherein s1, s0=0, 1 is prohibited.

Each of the $10^{th}$ to $14^{th}$ 3-input multiplexers $17_{10}$ to $17_{14}$ and $20^{th}$ to $25^{th}$ 3-input multiplexers $17_{20}$ to $17_{25}$ outputs the signal input to each of the selected terminals, from the output terminal oa as one of the enable signals ENR0 to ENR4.

The decoding rule generating circuit 13 generates the enable signals ENR0 to ENR4, based on the address signal ADDR0, ADDR1 and the decoding-rule signal RUL10 to RUL14, RUL20 to RUL25, as will be explained below.

CASE(3)

The case where no memory block is determined as defective in the functional testing of the memory blocks In CASE(3), the decoding rule generating circuit 13 outputs the decoding-rule signal RUL10 to RUL14, RUL20 to RUL25 as level "Low".

In this case, the entire decoding-rule signals RUL10 to RUL14, RUL20 to RUL25 are set to a level "Low". At this time, the $10^{th}$ to $14^{th}$ and $20^{th}$ to $25^{th}$ 3-input multiplexers $17_{10}$ to $17_{14}$ and $17_{20}$ to $17_{25}$ select their input terminal ia.

A level "Low" signal is input to the input terminal ia of the $14^{th}$ 3-input multiplexer $17_{14}$, while its output terminal oa outputs an enable signal EN14 representing the level "Low". In this structure, a level "Low" signal is input to the input terminal ia of the $24^{th}$ 3-input multiplexer $17_{24}$. A level "Low" is input to the input terminal ia of the $25^{th}$ 3-input multiplexer $17_{25}$. The enable signals ENR24, ENR25 representing the level "Low" are output respectively from the output terminal oa of each of the $24^{th}$ and $25^{th}$ 3-input multiplexers $17_{24}$ and $17_{25}$. Thus, the $4^{th}$ and $5^{th}$ memory blocks (RAMB4, RAMB5) which receives the enable signals ENR24, ENR25 are always inactivated.

Particularly, when the address signal ADDR0, ADDR1=0, 0, the enable signal ENR20 is set to a level "High", to activate the $0^{th}$ random access memory block $11_0$;

when the address signal ADDR0, ADDR1=1,0, the enable signal ENR21 is set to a level "High", to activate the $1^{st}$ random access memory block $11_1$;

when the address signal ADDR0, ADDR1=0, 1, the enable signal ENR22 is set to a level "High", to activate the $2^{nd}$ random access memory block $11_2$;

when the address signal ADDR0, ADDR1=1, 1, the enable signal ENR23 is set to a level "High", to activate the $3^{rd}$ random access memory block $11_3$.

Thus, the enable signals ENR24, ENR25 are always set to a level "Low", and the redundant $4^{th}$ and $5^{th}$ random access memory block (RAMB4, RAMB5) are always inactivated.

CASE(4)

The case where one of non-redundant memory blocks, for example, the $1^{st}$ random access memory block (RAMB1) is determined as defective in the functional testing of the memory cells In CASE(4), the decoding rule generating circuit 13 outputs the decoding-rule signal RUL10 as level "Low" and the decoding-rule signals RUL11 to RUL14 and RUL20 to RUL25 as level "High".

The enable signal ENR1 from the $1^{st}$ multiplexer $17_1$ is always set at level "Low", while the enable signal ENR4 from the $4^{th}$ multiplexer $17_4$ can be set at level "High". Thereby the redundant $1^{st}$ random access memory block $11_1$ is inactivated, while the redundant $4^{th}$ random access memory block $11_4$ may be activated.

In this case, the decoding-rule signals are so determined that the enable signal EN0 is output as an enable signal ENR20 after going through the enable signal EN10;

a level "Low" signal is output as the enable signal ENR21;

the enable signal EN1 is output as the enable signal ENR22 after going through the enable signal EN12;

the enable signal EN2 is output as the cable signal ENR23 after going through the enable signal EN13; and the enable signal EN3 is output as the enable signal ENR24 after going through the enable signal EN14.

Particularly, when the address signal ADDR0, ADDR1=0, 0, the enable signal ENR20 is set to a level "High", to activate the $0^{th}$ random access memory block (RAMB0);

when the address signal ADDR0, ADDR1=1, 0, the enable signal ENR22 is set to a level "High", to activate the $2^{nd}$ random access memory block (RAMB2);

when the address signal ADDR0, ADDR1=0, 1, the enable signal ENR23 is set to a level "High", to activate the $3^{rd}$ random access memory block (RAMB3);

when the address signal ADDR0, ADDR1=1, 1, the enable signal ENR24 is set to a level "High", to activate the $4^{th}$ random access memory block (RAMB4).

Thus, the enable signals are set as above, thereby the $1^{st}$ random access memory block (RAMB1) is always inactivated and the redundant $4^{th}$ random access memory block (RAMB4) may be activated.

More generally, in the case where there is detected one defective memory block which can be activated in response to an enable signal ENRn (n is an integer in a range from 0 to 4), the decoding-rule signals RUL1n to RUL14 are all set to a level "High", and the rest of the decoding rules signals are all set to a level "Low".

CASE(5)

The case where two of non-redundant memory blocks, for example, the $1^{st}$ and $3^{rd}$ random access memory block (RAMB1, RAMB3) are determined as defective in the functional testing of the memory cells In CASE(5), the decoding rule generating circuit 13 outputs the decoding-rule signals RUL10 as level "Low", the decoding-rule signals RUL11 to RUL14 as level "High", the decoding-rule signals RUL20 to RUL22 as level "Low" and decoding-rule signals RUL23 to RUL25 as level "High".

In this case, the decoding-rule signals (RUL) are so determined that:

the enable signal EN0 is output as the enable signal ENR20 after going through the enable signal EN10;

a level "Low" signal is output as the enable signal ENR21;

the enable signal EN1 is output as the enable signal ENR22 after going through the enable signal EN12;

a level "High" signal is output as the enable signal ENR23;

the enable signal EN2 is output as the enable signal ENR24 after going through the enable signal EN13; and the enable signal EN3 is output as the cable signal ENR25 after going through the enable signal ENR14.

Particularly, when the address signal ADDR0, ADDR=0, 0, the enable signal ENR20 is set to a level "High", to activate the $0^{th}$ random access memory block (RAMB0);

when the address signal ADDR0, ADDR1=1, 0, the enable signal ENR22 is set to a level "High", to activate the $2^{nd}$ random access memory block (RAMB2);

when the address signal ADDR0, ADDR1=0, 1, the enable signal ENR24 is set to a level "High", to activate the $4^{th}$ random access memory block (RAMB4);

when the address signal ADDR0, ADDR1=1,1, the enable signal ENR25 is set to a level "High", to activate the $5^{th}$ random access memory block (RAMB5).

Thus, the enable signals are set as above, thereby the $1^{st}$ and $3^{rd}$ random access memory block (RAMB1, RAMB3), determined as defective, are always inactivated, while the redundant $4^{th}$ and $5^{th}$ random access memory block (RAMB4, RAMB5) may be activated.

More generally, in the case where it is determined that two memory blocks, which are activated respectively in response to enable signals ENRn (n is an integer in a range from 0 to 4) an ENRm (m is an integer in a range from 0 to 5 and n<m), are defective memory blocks, the decoding-rule signals RUL1n to RUL14 are all set to a level "High", the decoding-rule signals RUL2m to RUL25 are all set to a level "High", and the rest of the decoding-rule signals are all set to a level "Low".

Figure 5:
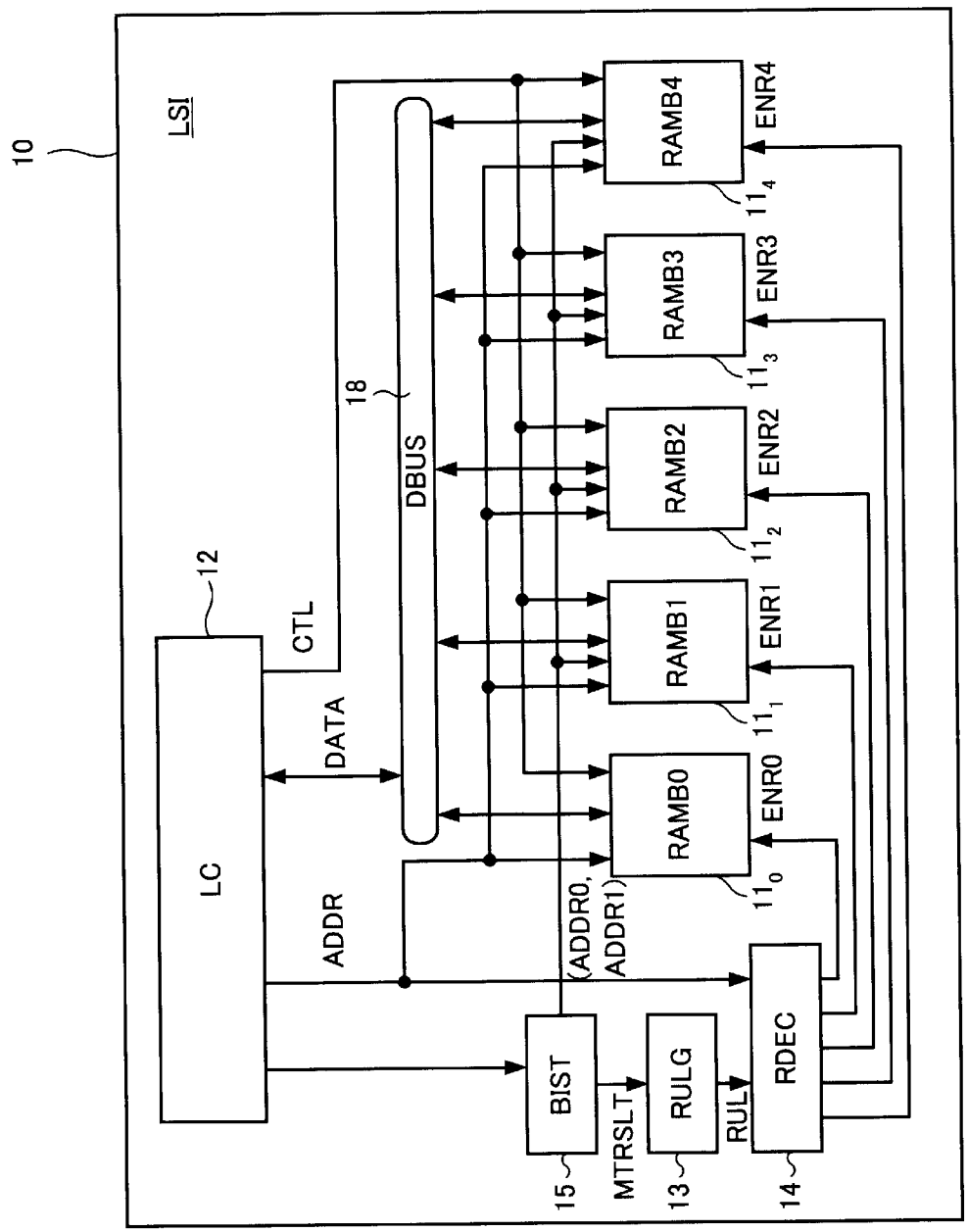
FIG. 5 is a diagram showing the structure of a logical integrated circuit device which is a modified form of FIG. 1.

In the above embodiment, the $0^{th}$ to $4^{th}$ random access memory blocks $11_0$ to $11_4$ include the $0^{th}$ to $4^{th}$ built-in self-test circuits $15_0$ to $15_4$. However, the built-in self-test circuits may be prepared independently from the memory blocks. Alternatively, as shown in FIG. 5, a single built-in self-test (BIST) 15 may perform the functional testing of the entire memory blocks.

In the above embodiment, the logic integrated circuit device may include a circuit which generates an error signal in the case where the number of the defective memory blocks is greater than the number of the redundant memory blocks. For example, in the case where there is one redundant memory block included in five memory blocks, if there are detected two defective memory blocks. The circuit outputs an error signal, causing the entire memory blocks not to be accessed.

In the above embodiment, each of the memory blocks may include a redundancy circuit, which may typically be a redundant element or a fuse, etc. With such a redundancy circuit, the defective memory cell(s) included in a memory block can be repaired, and further improving the product yield and reliability of the logic integrated circuit device.

The logic integrated circuit device having the above-described structure may be connected to a CPU, a ROM, an external memory and the like, so as to form a computer system. The structure of such a computer system is shown in FIGS. 6 to 8.

Figure 6:
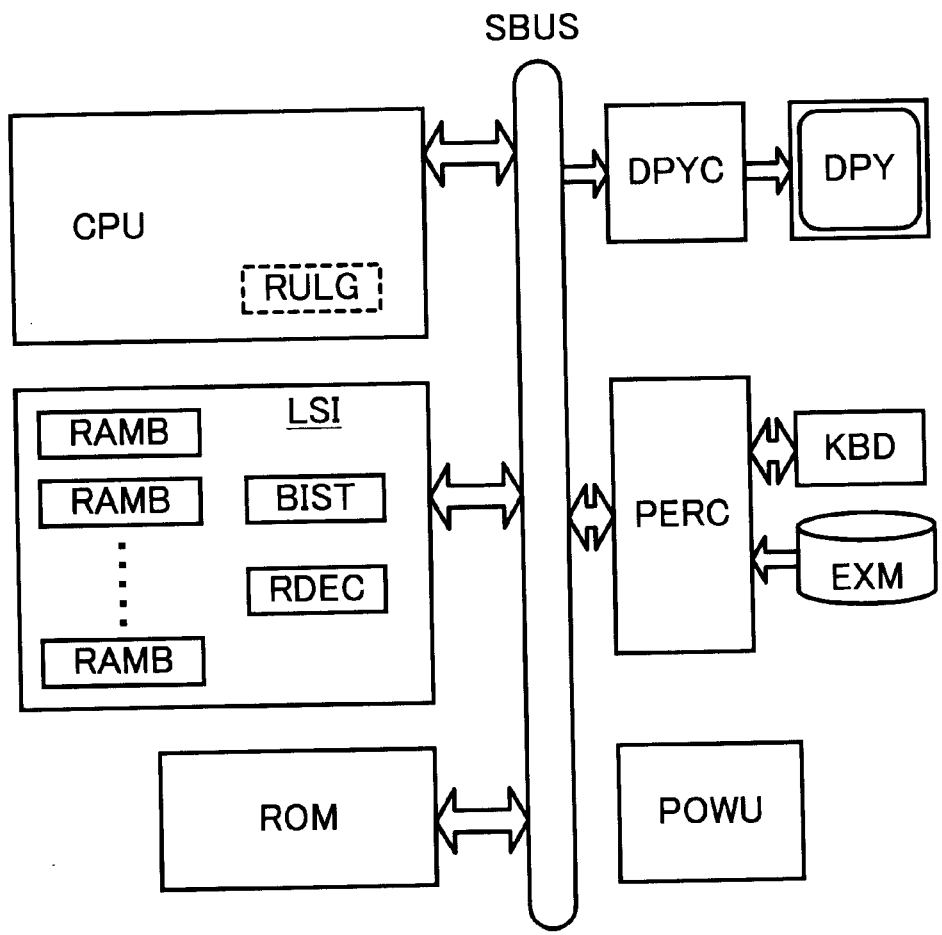
FIG. 6 is a diagram showing the structure of a computer system including the logical integrated circuit device of FIG. 5.

The computer system shown in FIG. 6 includes a keyboard (KBD), a display (DPY) connected to a display controller (DPYC), a power source (POWU) and the like, and each of the above circuit devices is connected with each other through a system bus (SBUS).

In the structure shown in FIG. 6, the CPU which controls the computer system includes a decoding rule generating circuit 13. The built-in self-test circuit (BIST) is included in the logic integrated circuit (LSI) including the memory blocks (RAMB). The CPU receives the test result from the built-in self-test circuit (BIST), and creates the decoding rule based on the received test result.

Figure 7:
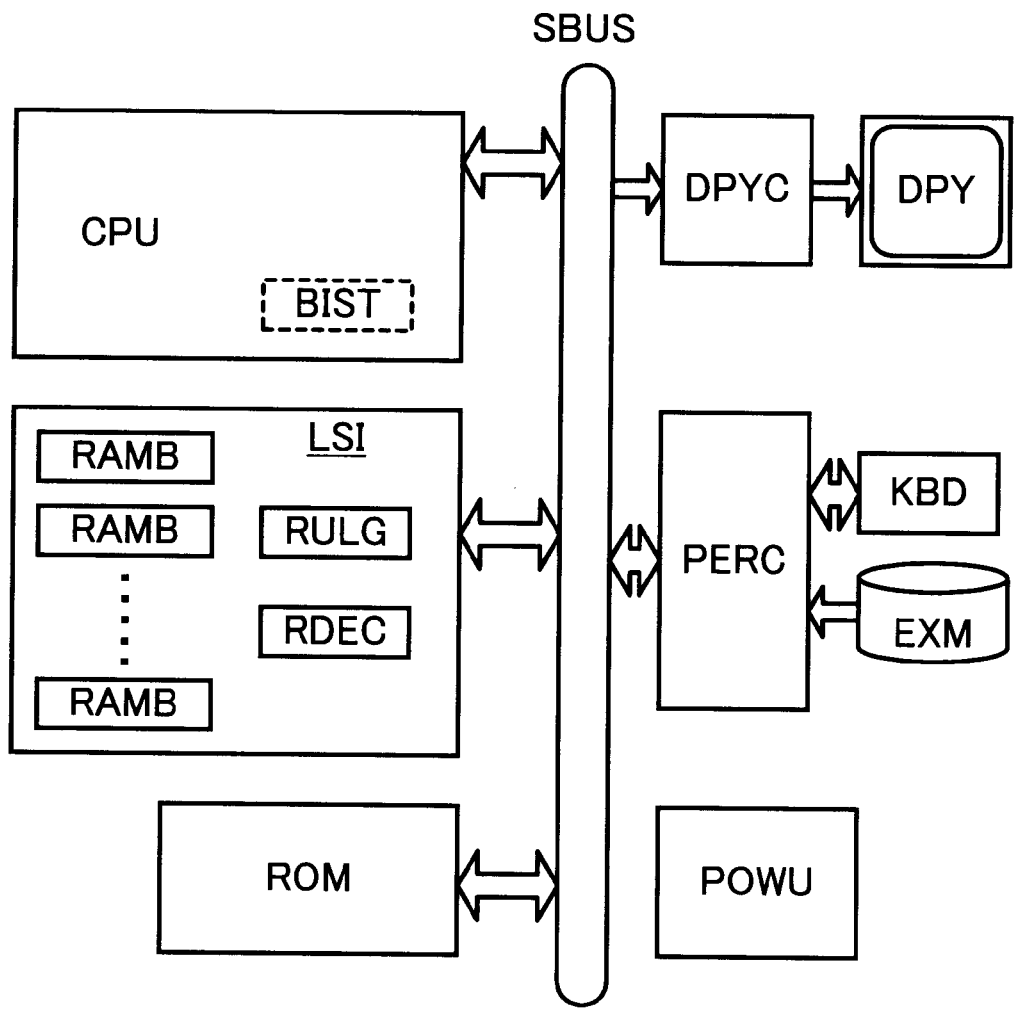
FIG. 7 is a diagram showing the structure of another computer system including the logical integrated circuit device of FIG. 5.
Figure 8:
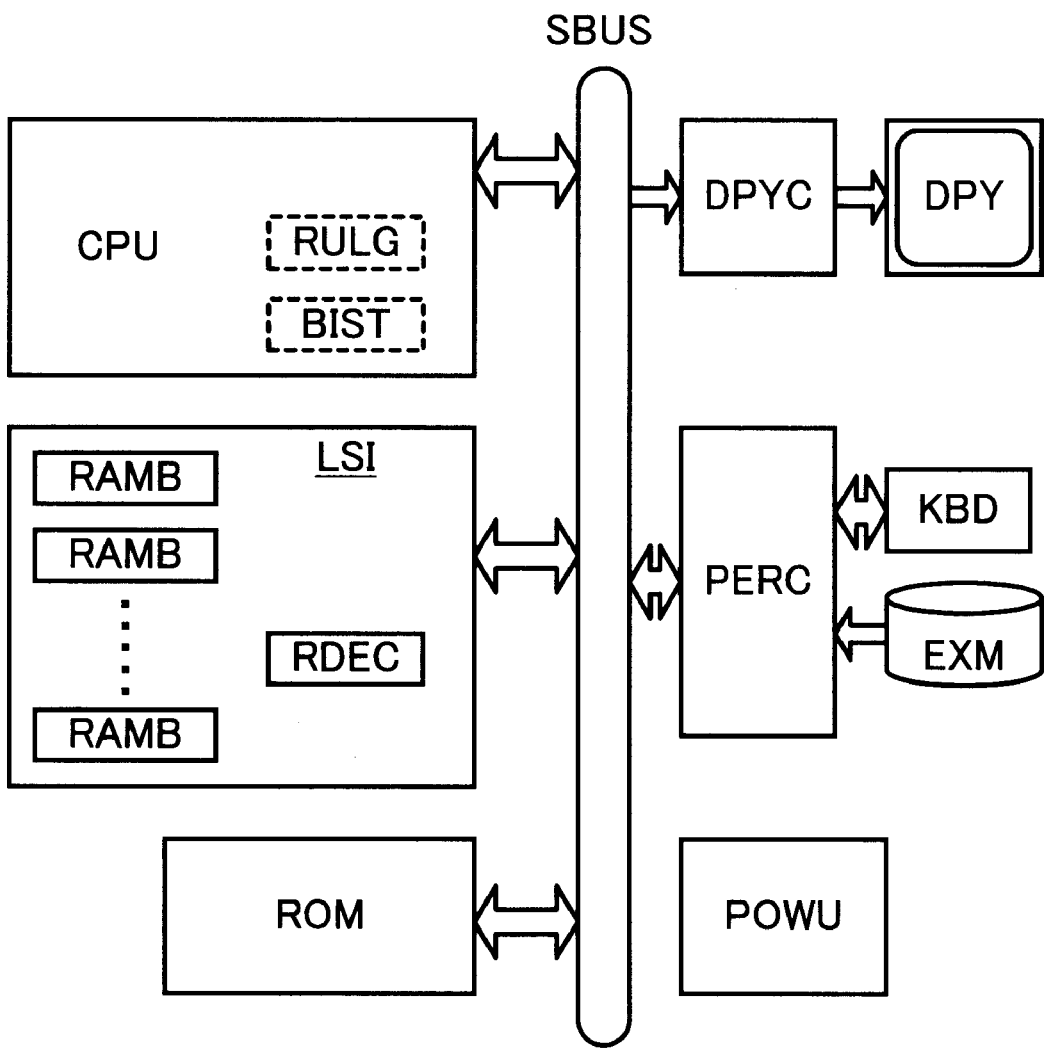
FIG. 8 is a diagram showing the structure of still another computer system including the logical integrated circuit device of FIG. 5.
Figure 9:
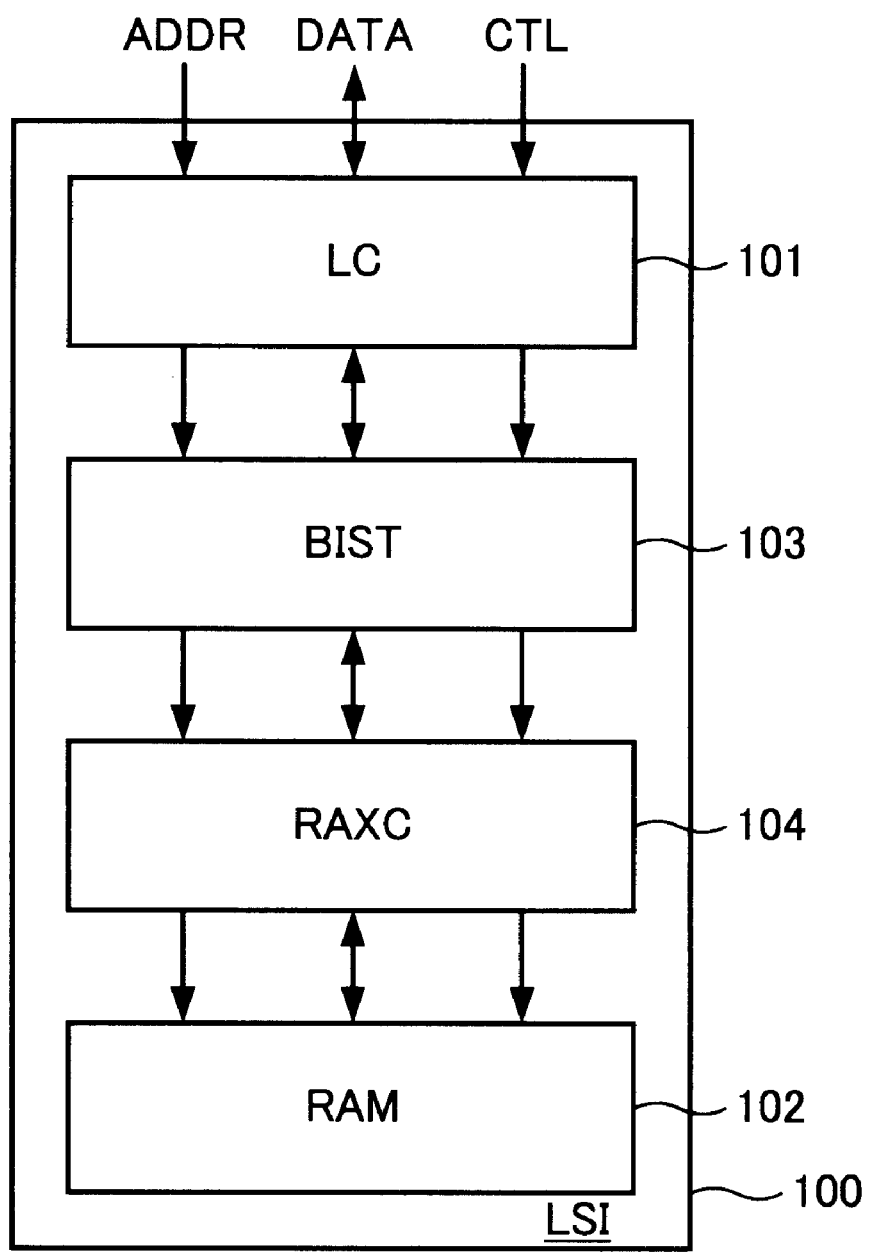
FIG. 9 is a diagram showing the structure of a conventional redundancy circuit.

As seen from FIG. 7, in the structure of the computer system, the built-in self-test circuit (BIST) may be included in each of the memory blocks (RAMB).

In the structure shown in FIG. 7, the CPU includes the built-in self-test circuit (BIST). The CPU performs the functional testing of the memory blocks (RAMB) included in the integrated circuit (LSI), and sends a signal representing the result of the test to the decoding rule generating circuit 13 of the integrated circuit (LSI). The decoding rule generating circuit 13 generates a decoding-rule signal based on the result of the test, and outputs generated decoding-rule signal to the redundant address decoder 14.

In the structure shown in FIG. 8, the CPU includes the built-in self-test circuit (BIST) and the decoding rule generating circuit 13. The CPU sends a decoding-rule signal to the redundant address decoder (RDEC), based on the result of the test.

In the above embodiment, the explanations have been made to the case where the random access memory blocks are employed. However, the present invention can be adapted for any memory circuits each having the structure of memory blocks. For example, the present invention can be employed to various semiconductor memories, such as ROMs, flash memories, etc. In addition, the present invention can be employed to various digital integrated circuit devices including such a semiconductor memory.

Various embodiments and changes may be made thereonto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2001-120853 filed on Apr. 19, 2001, and including specification, claims, drawings and summary. The disclosure of the above Japanese Patent Application is incorporated herein by reference in its entirety.

What is claimed is:

1. A semiconductor device comprising:

a memory circuit including a plurality of memory blocks and at least one redundant memory block;

a test circuit which performs functional testing of said memory circuit in unit of blocks;

a selecting-role generating circuit which generates a selecting rule for selecting accessible memory blocks, so that the one or more memory block(s) among the plurality of the memory blocks which is(are) determined as defective by said test circuit will be avoided, while the at least one redundant memory block of the same number of the one or more memory block(s) determined as defective will be accessible;

a block selecting circuit which selects the accessible memory blocks, based on the selecting rule generated by said selecting-rule generating circuit; and a logical circuit which accesses the accessible memory blocks to read/write data therefrom/thereto.

2. The semiconductor device according to claim 1, wherein said test circuit is provided in each of said memory blocks.

3. The semiconductor device according to claim 1, wherein said test circuit is included in said logic circuit.

4. The semiconductor device according to claim 1, wherein said selecting-rule generating circuit is included in said logic circuit.

5. The semiconductor device according to claim 1, wherein said test circuit and said selecting-rule generating circuit are included in said logic circuit.

6. A system including the semiconductor device according to claim 1.

7. A method of controlling accessing to a memory circuit comprising a plurality of memory blocks and at least one redundant memory block, said method comprising:

performing functional testing of said memory circuit in unit of the memory blocks, and determining whether each of the plurality of memory blocks is defective;

generating a selecting rule for selecting accessible memory blocks, so that the one or more memory block(s) among the plurality of the memory blocks which is(are) determined as defective by said testing will be avoided, while the at least one redundant memory block of the same number of the one or more memory block(s) determined as defective will be accessible;

selecting the accessible memory blocks, based on the selecting rule generated; and accessing the accessible memory blocks to read/write data therefrom/thereto.

* * * * *